United States Patent [19]

Kamigaki et al.

[11] Patent Number: 5,038,193
[45] Date of Patent: Aug. 6, 1991

[54] SEMICONDUCTOR INTEGRATED CIRCUIT DEVICE

[75] Inventors: Yoshiaki Kamigaki, Tokorozawa; Shinichi Minami; Kazunori Furusawa, both of Kodaira; Yoshifumi Kawamoto, Tsukui; Shoji Shukuri, Koganei; Masaaki Terasawa, Akishima; Yasunori Ikeda, Kawagoe; Hidefumi Mukohda, Akishima, all of Japan

[73] Assignees: Hitachi VLSI; Hitachi, Ltd. & Engineering Corp., both of Tokyo, Japan

[21] Appl. No.: 541,751

[22] Filed: Jun. 21, 1990

[30] Foreign Application Priority Data

Jun. 22, 1989 [JP] Japan ............................ 1-158190

[51] Int. Cl.$^5$ ............ H01L 27/12; H01L 29/06; H01L 27/02; H01L 29/68
[52] U.S. Cl. .......................... 357/49; 357/55; 357/41; 357/23.5
[58] Field of Search ............ 357/49, 55, 41, 23.5

[56] References Cited

FOREIGN PATENT DOCUMENTS 61-281546 12/1986 Japan .

Primary Examiner—Mark Prenty
Attorney, Agent, or Firm—Antonelli, Terry, Stout & Kraus

[57] ABSTRACT

In the semiconductor integrated circuit device provided with a plurality of second well regions of the same conductivity type, formed by dividing a first well region provided in the semiconductor substrate by an isolation trench, the isolation trench is substantially linear on the semiconductor substrate surface and the ends reach out of the first well region, however there is no intersection part, namely a corner part T part or cross part in the isolation trench. Therefore, no cavity occurs in the filler in the trench and stress is not concentrated on the intersection part. In addition, defects due to junction leak or mechanical damage do not occur, that is, there is no characteristic deterioration occuring. By providing the second well with memory cell, a semiconductor memory device whose characteristic defect rate and reliability defect rate are remarkably low can be formed.

21 Claims, 10 Drawing Sheets

FIG. 13  DATA-LATCH LOADING OF MEMORY CELL DATA

SEMICONDUCTOR INTEGRATED CIRCUIT DEVICE

BACKGROUND OF THE INVENTION

This invention relates to a semiconductor integrated circuit device and, more specifically, to a semiconductor integrated circuit device comprising a plurality of well regions of the same conductivity type by providing a well region in the semiconductor substrate and providing an isolation trench extending inwardly from the well region surface the above semiconductor substrate and in particular, relates to an especially effective technology applicable to a semiconductor memory device having memory cells formed in a plurality of isolated well regions of the same conductivity type and having at least one isolated well region to which there is applied a voltage different from other well regions.

According to technology for forming a plurality of circuit blocks or devices on the well on a semiconductor substrate in high density and also isolating the circuit blocks and devices securely, the technology of providing a well with an isolation trench extending from the well surface to the above substrate is known. In a semiconductor integrated circuit device of this type, the electrically-erasable-programmable programmable read only memory (EEPROM), which was invented by the present inventors, is known as shown in Japanese Patent Laid-Open No. 61-281546.

In the above EEPROM, many memory cells are formed in wells of the same conductivity type which are isolated by trenches in the semiconductor substrate, and are composed such that individual memory cell groups which consist of a specified number of memory cells are respectively isolated from each other by surrounding each well with isolation trenches so as to enable the erase, write and read of information with respect to every specified number of memory cells (for example, every byte).

According to an experiment by the present inventors, although the semiconductor integrated circuit device by the conventional technology mentioned above was effective for improving the integration density, processing defects occurred in the production and degradation of operating characteristics degradation was sometimes observed while such semiconductor integrated circuit device was used. The inventors further found that such problems originated from the shape of the isolation trench. In the trench isolations achieved by the conventional technology mentioned above, as shown in FIG. 19, the isolation trenches 2 surround each of the memory cell groups in the well 1, and therefore the intersection part of the isolation trenches, that is, the corner part "C", the T part "D" and the cross part are provided as shown in "C" and "D". As shown in FIG. 20, a cavity 12 develops in the filler of the isolation trench 2 and/or the stress is concentrated on the intersection part. By those reasons, a junction leak occurs as a result of such concentrated stress or mechanical destruction occurs, thereby causing a defective product and/or with a characteristics degradation.

SUMMARY OF THE INVENTION

The object of the present invention is to overcome the difficulties associated with the conventional technology mentioned above and realize a high-density semiconductor integrated circuit device using trench isolations without having to be concerned with development of defects by the occurrence of a cavity in the filler of the isolation trench and occurrence of stress concentration. Another object of the present invention is to realize a semiconductor integrated memory circuit device which would seldom be associated with a defect resulting by means of the trench isolation mentioned above.

To achieve the above objects, the semiconductor integrated circuit device of the present invention is provided with a plurality of second well regions of the same conductivity type obtained by dividing the first well region by an isolation trench extending inwardly from its surface toward the substrate to a depth direction greater than the well region. The above isolation trench is provided without having an intersection part, as described above, at either end thereof while extending inwardly from the semiconductor substrate front face in the direction of substrate depth, greater than that of the first well region to which that isolation trench belongs.

Usually, the above isolation trenches are substantially straight and are disposed so as to be substantially in parallel with each other in accordance with a plan view with respect to the semiconductor substrate face and cross, with respect to a cross-sectional view thereof, they are also substantially in parallel to the substrate front face, and that the straight section length thereof, that is inn the lateral direction (parallel to the front face) is set to be greater than the width of the first well region (the width being in the direction of that straight section) "Straight" mentioned here means a shape of an almost (or substantially) straight line without a corner part, T section and cross part.

The isolation trench depth is set greater than the depth of the first well region. Because the depth of the first well region is usually about 4 μm, in this case, the depth of the isolation trench may be desirably more than 5 μm. As described above, the isolation trench reaches out of the first well region except the opening part thereof.

To form a satisfactory wiring layer or the like on the semiconductor substrate, an insulator, such as polycrystalline silicon, $SiO_2$ and $Si_3N_4$ is filled in the isolation trench. To fill the isolation trench with polycrystalline silicon satisfactorily, the side walls of the isolation trench are inclined and the inclination angle ($\theta$ in FIG. 2) is set equal to or less than 85 degrees. If the inclination angle exceeds 85 degrees, the filling thereof of polycrystalline silicon becomes difficult.

To secure the bottom area of the isolation trench, if the trench depth is 5 μm and the inclination angle of the trench side wall is 85 degrees, the width of the opening (w in FIG. 2) of the isolation trench shall be more than 1 μm. In this case, the width of the bottom of the isolation trench, if obtained geometrically, is about more than 0.125 μm.

The width of each of the well regions divided by the isolation trench or the width of each of the second well region surfaces is determined from the design viewpoint according to the number of memory cells to be formed in this region and the pitch associated therewith in the memory cell word line direction.

The inside wall of the isolation trench is coated with oxide film of about 1,000; or more in thickness. This is so as to insure insulation between the inside and outside of the trench in the case a conductor, such as polycrystalline silicon, is filled in the trench.

The bottom portion of the isolation trench is doped with an impurity of opposite conductivity type to the first well region to which that trench belongs in order to prevent a punch-through between the neighboring second well regions. The doping amount is desired to be $10^{12}$ through $10^{14}$ cm$^{-2}$. For this doping amount, it is desirable to dope with an impurity vertically through ion implantation so as to prevent the side wall from being doped therewith. If the side wall of the trench is doped with an impurity, an undesirable leak of the minority carriers might occur.

As a material to be filled in the isolation trench, polycrystalline silicon or insulator mentioned previously can be used. If a potential change resulting from a capacitance coupling with the neighboring second well, is not desired, it is recommended to fill the trench with conductors, such as polycrystalline silicon and WSi$_2$, and apply an electric potential (usually, grounding potential) thereon.

It is desirable to provide an oxide film by local oxidation of silicon (LOCOS) around the opening of the isolation trench at the silicon substrate surface in order to make the electric property of each of the memory cells uniform. In addition, because LOCOS is implemented before the trench is formed, the stress resulting from the oxidation at high temperature after the formation of the trench is slight.

By providing a cap composed of an insulating layer over the isolation, which is filled with polycrystalline silicon or the like, to cover the trench, it is possible to prevent the conduction between the wiring on the substrate and filler in the trench. The lower limit of the thickness of the cap is determined by the dielectric strength and the capacitance coupling property, and the upper limit is determined by an obstacle due to the level (or a level gradient) at the cap layer. Generally, the desirable thickness is about 100 nm; however, it is not always confined to this value.

In case a semiconductor memory device containing a memory cell and peripheral circuit is constructed as a semiconductor integrated circuit device, the peripheral circuit composed of the memory cell and MOS transistor of the same conductivity type as that of the memory cell is formed in the second well region and is isolated by the isolation trench mentioned above; and out of the well region to which the trench belongs, in the longitudinal direction of the isolated second well region, namely, in the direction of being not isolated by the isolation trench, the other well with opposite conductivity type to the well in which a memory cell is installed is installed, and the other peripheral circuit composed of the MOS transistor with opposite conductivity type to the peripheral circuit mentioned above or the memory cell is arranged.

The number of memory cells, namely the bit number, formed in the second well isolated by the isolation trench is desired to be set in the unit of byte or a an integer multiple of a byte or a number so as to coincide with the unit of readout/write wherein the bit number for error correction code is added to the integer multiple of the above unit of a byte.

In the case of the semiconductor integrated circuit device of the present invention, because the isolation trench isolating a well is provided with no intersection part and is substantially straight, along its length the filler is filled uniformly in the trench so that a cavity seldom occur and the trench is substantially formed uniformly In addition, because no corner part are formed such as an intersection part, thermal stress or mechanical stress is hardly concentrated, so that the causes of destruction and electric leak are removed. As a result, the yield rate, characteristics and reliability of such semiconductor integrated circuit devices produced are improved.

DESCRIPTION OF THE PREFERRED EMBODIMENTS

Figure 1:
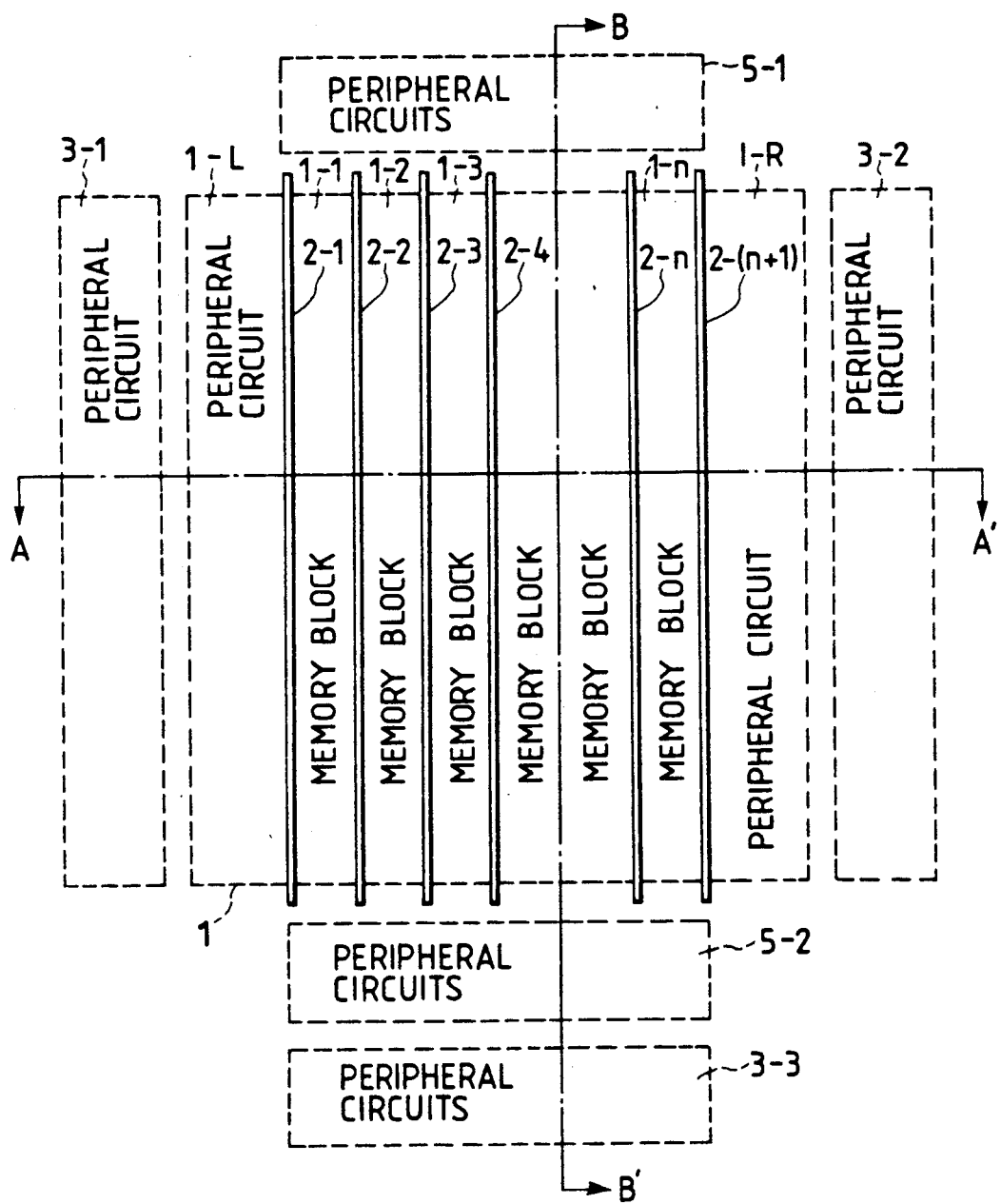
FIG. 1 is the plan view showing the configuration of the semiconductor integrated circuit device of an embodiment of the present invention.
Figure 2:
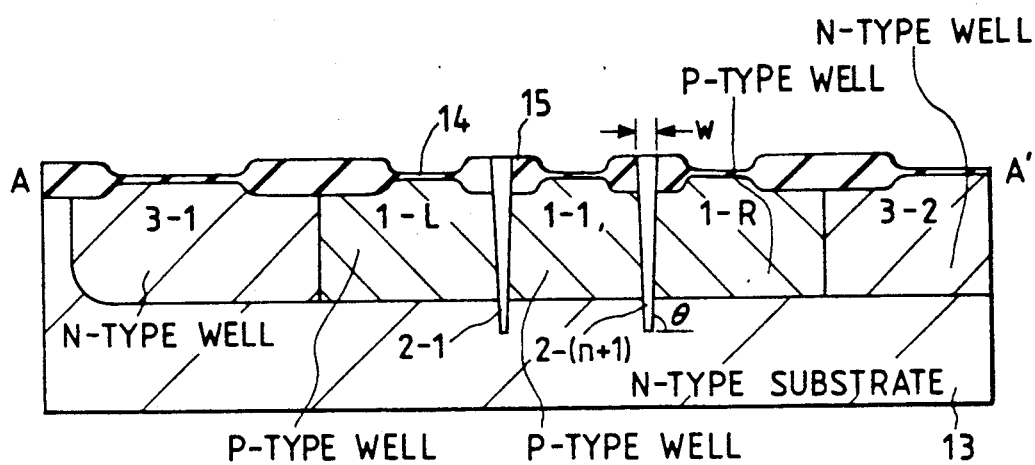
FIG. 2 is the sectional view showing the cross section A-A' in FIG. 1.
Figure 3:
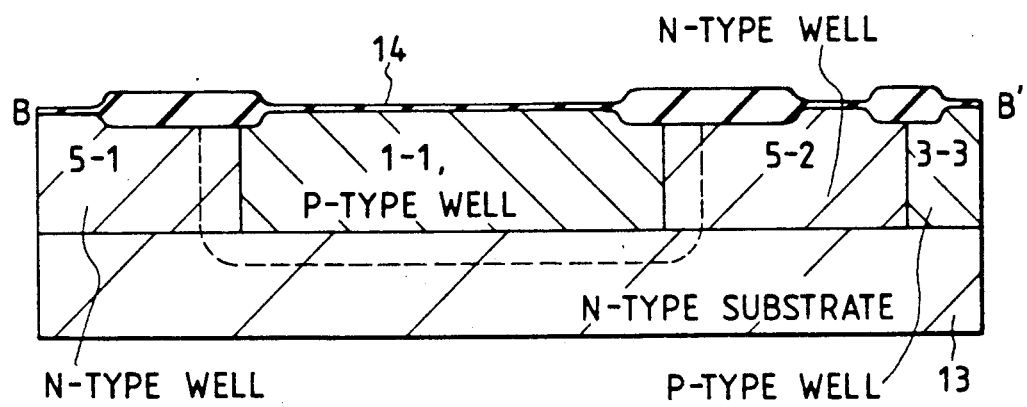
FIG. 3 is the sectional view showing the cross section B-B' in FIG. 1.

FIG. 1 shows the schematic plan view of the semiconductor integrated circuit device of the present embodiment, in particular of an EEPROM. In FIG. 1, the individual sections surrounded by broken line corresponded to the well regions formed on a semiconductor substrate. The cross sections A-A' and B-B' of FIG. 1 are shown in FIGS. 2 and 3. The p-type well region 1 formed on the n-type semiconductor substrate 13 is divided into a plurality of isolated well regions 1-L, 1-1 through 1-n and 1-R by the linear and parallel trenches 2-1 through 2-(n+1). On the well surface, the isolation trenches are longer than the width in the trench direction of the well 1 (vertical direction in FIG. 1), and are deeper than the well in the vertically inward direction from the well surface, reaching the substrate 13. In the isolated p-type well regions 1-1 through 1-n (only 1-1 is illustrated in FIG. 2 for simplification), the array of the n-type memory cell is allocated, and the peripheral circuit composed of n channel type transistors is allocated in the isolated p-type well regions 1-L and 1-R. As shown in FIG. 3, in which the p-type well region 1-1 is shown, the peripheral circuit composed of MOS transistor with opposite conductivity type to the memory cell is formed in the n-conductivity type wells 5-1 and 5-2, namely opposite conductivity type to the well region 1, allocated in the direction B-B' in FIG. 1. The wells 5-1, 5-2, 3-1 and 3-2 provided with peripheral circuits are n-conductivity type wells which are of opposite conductivity type to the well 1. The well 3-3 is of opposite conductivity type to the well 5-2. As evident from FIG. 2, to isolate the p-type well region 1 on the n-conductivity type semiconductor substrate 13 into a plurality of wells, the isolation trenches 2-1 through 2-n are formed in the depth direction from the well surface, deeper than the former well. As shown in FIG. 2, on the section A-A' of FIG. 1, the peripheral circuit isolated by the isolation trench 2-1 or 2-(n+1) from the memory cell array is composed of the transistors of the same n-channel type as the memory array, in the p-type conductivity well 1-L or 1-R.

In FIGS. 2 and 3, the reference numeral 14 indicates the gate insulating film and 15 indicates oxide layer due to LOCOS.

Next, the process of forming the isolation trench for isolating the wells is described according to FIGS. 4 to 12.

Figure 4:
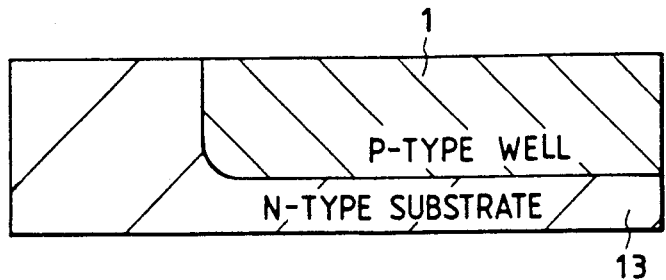
FIGS. 4 through 12 are the sectional views showing the processes for forming the trench isolation of the semiconductor integrated circuit of an embodiment of the present invention.

On the first process, p-type well 1 is formed on the n-type semiconductor substrate 13 having the substrate specified resistance of 10 Ωcm (see FIG. 4). The well 1 was doped with boron (B) as p-type impurity by $2-3 \times 10^{12}$ cm$^{-2}$ and diffused under 1,200° C. for 6 hours. The depth of the well "1" is about 4 μm.

Figure 5:
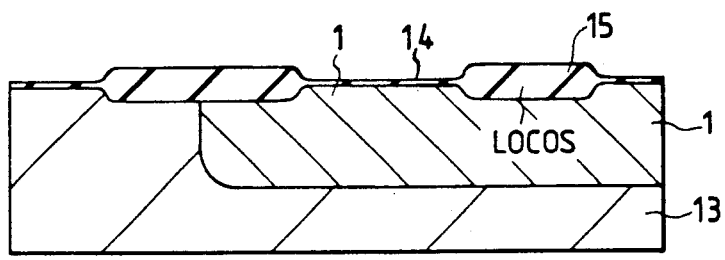

On the second process, LOCOS isolation band 15 is formed as the boundary between the active area and the field area, by an extension of the conventional technology (see FIG. 5).

In FIG. 5, the gate insulating layer 14 is SiO$_2$ layer of about 20 nm in thickness, which is thermal oxide layer.

Figure 6:
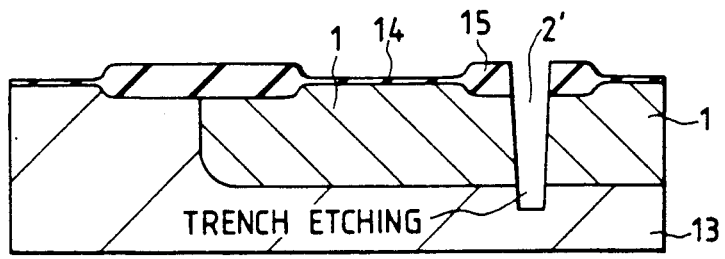

On the third process, the isolation trench 2' is formed in this LOCOS isolation band (see FIG. 6). By anisotropic dry etching, for example, low-temperature micro-wave plasma etching, with photo resist as mask, the silicon oxide layer of LOCOS and the silicon substrate are trench-etched continuously.

At this time, the width of the isolation trench 2' at the opening is about 1 μm and the depth is about 5 μm. The isolation trench 2' reaches the n-type semiconductor substrate 13 through the well 1. The isolation trench 2' is narrower more inside. The inclination angle is about 85 degrees.

Figure 7:
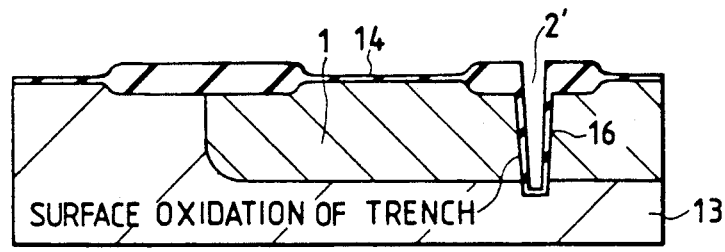

On the fourth process, the side wall of the isolation trench 2' is thermally oxidized to cover the isolation trench 2' with an oxide insulating layer 16 (see FIG. 7). The thickness of the wall oxide insulating layer 16 is about 100 nm. The surface except the wall of the trench 2' is covered with the oxidation preventing layer (for example, Si$_3$N$_4$ layer) formed before the trenches are formed by etching.

Figure 8:
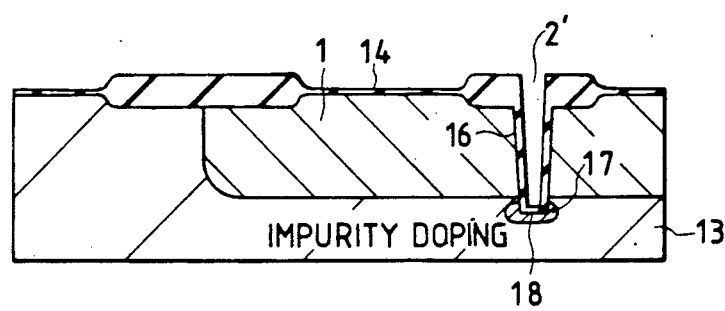

On the fifth process, the bottom of the isolation trench 2' is doped with the n-type impurity 18 to achieve electrical isolation (see FIG. 8). There is doped vertically with phosphorous (P) as the impurity by $10^{13}$ cm$^{-2}$ into the substrate via the oxide layer on the bottom of the trench. In FIG. 8, the numeral 17 indicates the range where the doping impurity is diffused after heat treatment.

Figure 9:
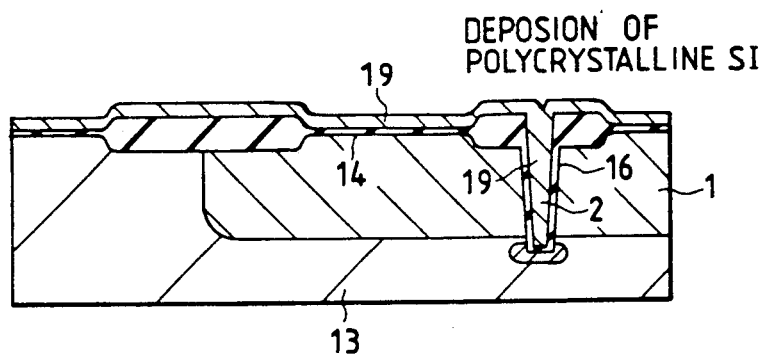

On the sixth process, polycrystalline silicon 19 is deposited for the isolation trench portion 2 to be filled with (see FIG. 9). At this time, polycrystalline silicon on the surface of the well is deposited to the thickness of at least half of the trench width, namely at least 0.5 μm so that the trench 2 is filled with. Because the isolation trench 2 is inclined, the filling is performed from the deepest part of the trench, so that no cavity is formed.

Figure 10:
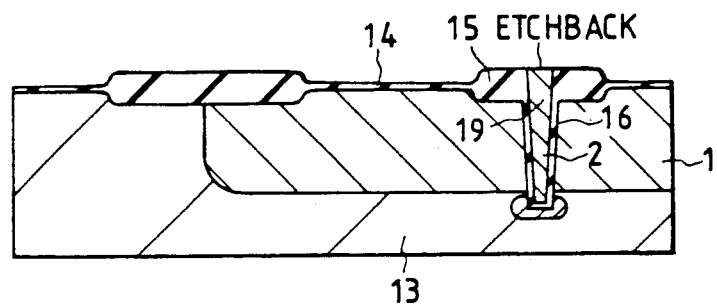

On the seventh process, the deposited polycrystalline silicon is etched back to leave polycrystalline silicon in only the trench portion 2 (see FIG. 10).

Figure 11:
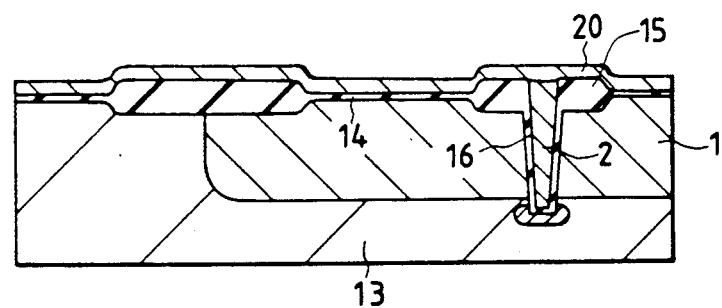

After that, on the eighth process, to provide this isolation trench 2 with a cap, the CVD SiO$_2$ film 20 of about 100 nm in thickness formed at high-temperature and low-pressure is deposited (see FIG. 11).

Figure 12:
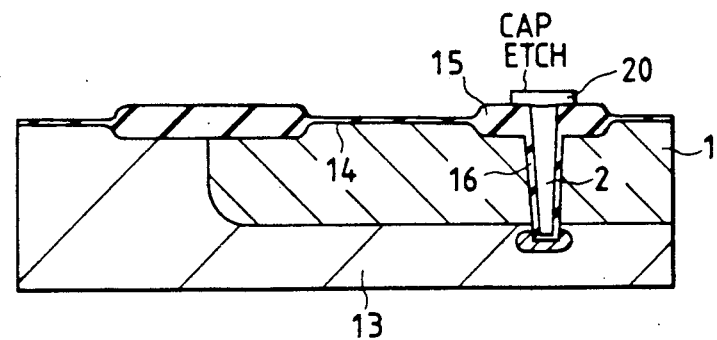

At last, by etching employing the photomask, the CVD film 20 is left only at the region covering the trench portion 2 so that the cap is formed (see FIG. 12).

Because the process for making a memory cell and circuit element in the isolated well region produced from the processes mentioned above is performed like the conventional process, the description is omitted.

Figure 13:
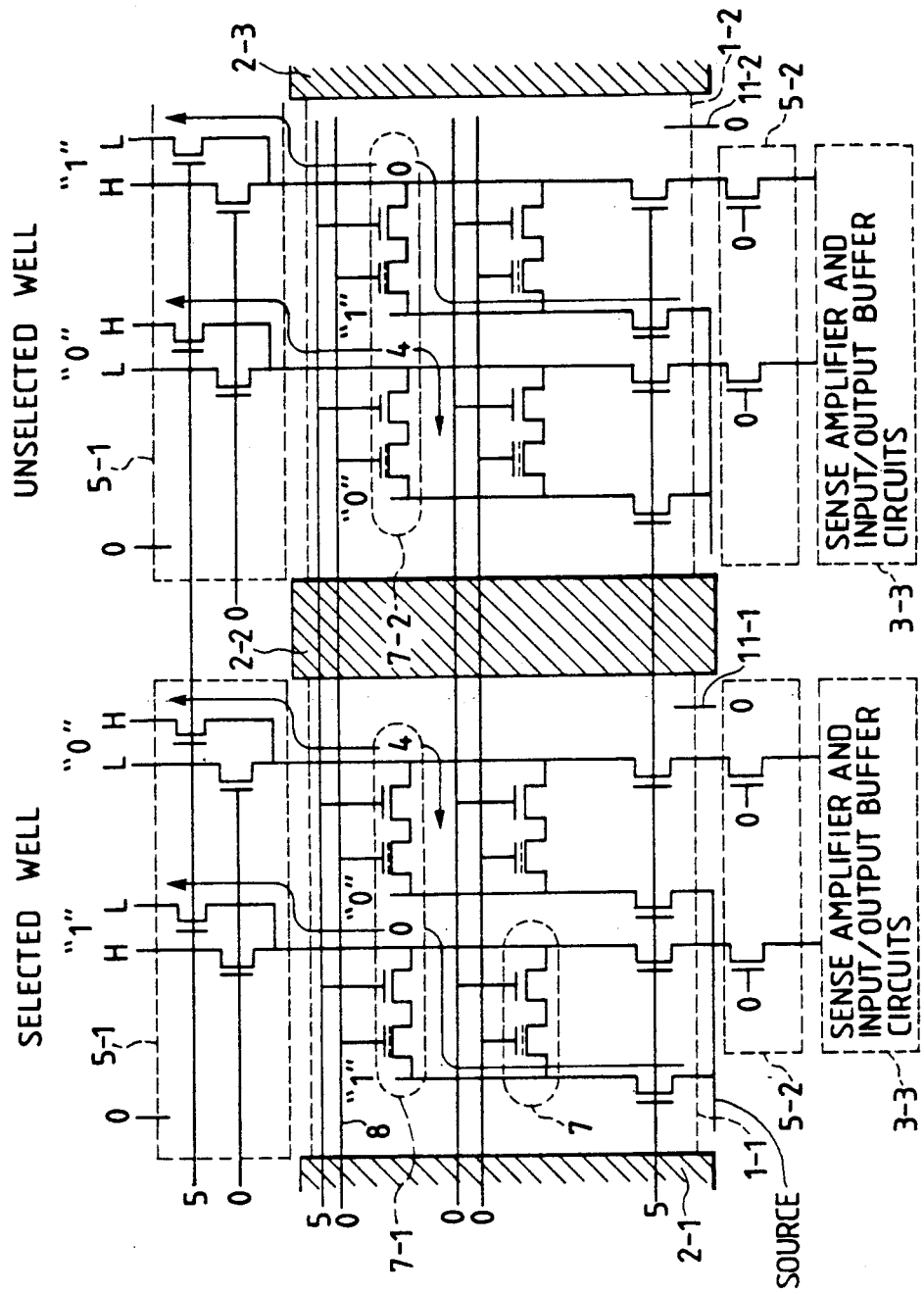
FIGS. 13 through 17 are the partial circuit diagrams showing the action of the memory device in the semiconductor integrated circuit device of an embodiment of the present invention.
Figure 17:
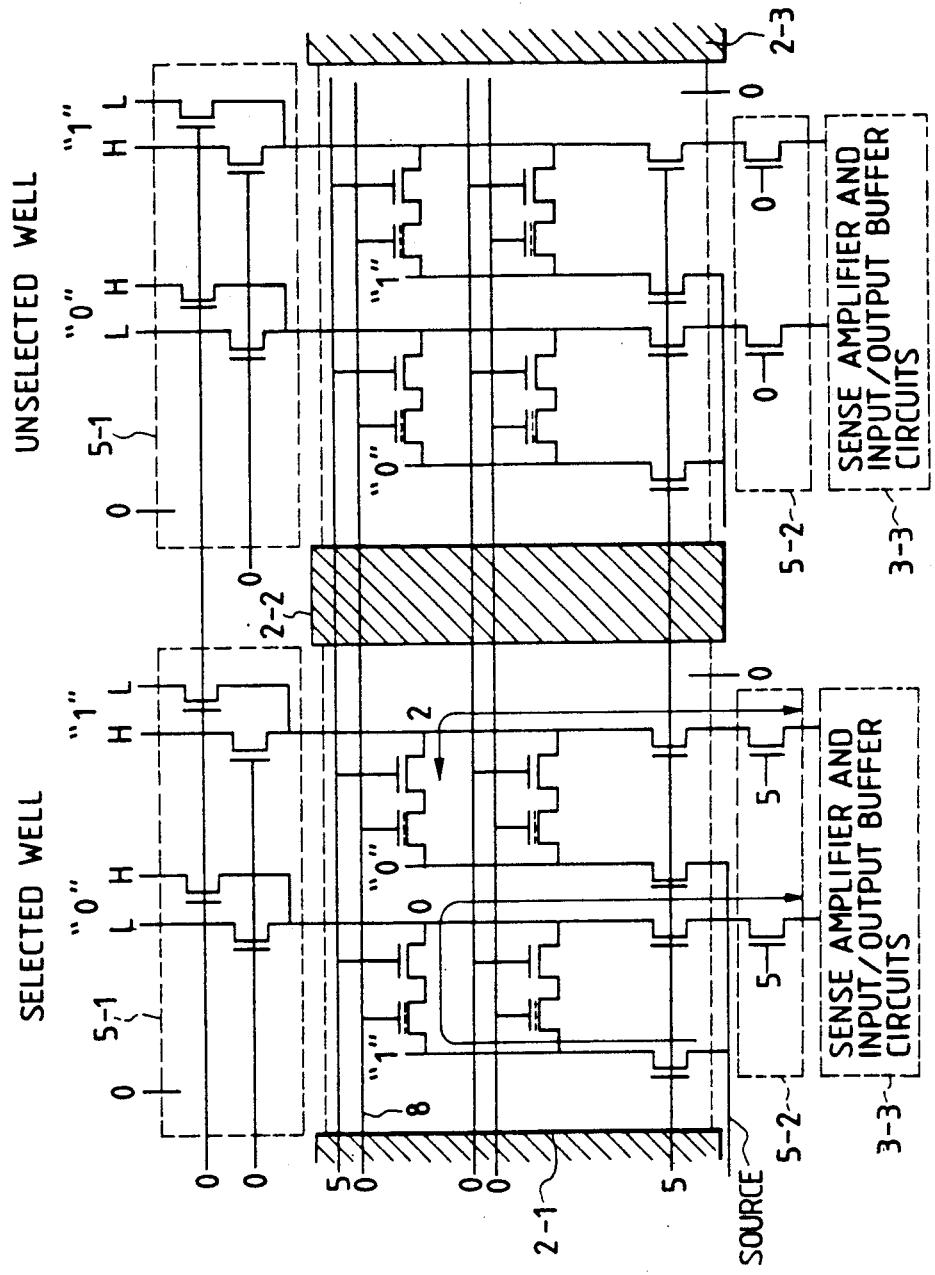

FIGS. 13 and 17 show an example of the formation of the n-channel 2-transistor MNOS (metal nitride oxide semiconductor) memory cell to be placed in the p-type wells 1-1 and 1-2 of FIG. 1, for illustrating the constitution and the action of the semiconductor memory device of FIG. 1. For the convenience of description, the configuration in the well is indicated with a circuit diagram. In each diagram, the hatched sections 2-1, 2-2 and 2-3 indicate the isolation trenches and the sections surrounded by broken lines indicate a well regions. The wells 1-1 and 1-2 are p-conductivity type wells and the transistor formed therein is composed of an n-channel MNOS transistor. The wells 5-1 and 5-2 are n-type wells and the transistor formed therein is composed of p-conductivity type MOS transistor. The selected address for programming and the unselected address on the same word line are isolated by the isolation trench 2-2. The numerals 0, 4, 4.4 and 5 and the symbol −Vp attached to the ends of solid lines in the Figures indicate voltages, −Vp indicates the negative high voltage of program, raised internally and the numeral 5 means 5 volts of power voltage Vcc. 4 and 4.4 means the values reduced from the power supply voltage of 5 V on the circuit, namely 4 V and 4.4 V. H and L indicates the data latch potentials of high level and low level each. The solid line with an arrow indicates the flow of electrons. Although the description here aims at providing an understanding of only the necessity of well isolation, these figures allow the details of the operation to be understood. The action of erasing, writing and reading out of the non-volatile memory (EEPROM), which can be electrically programmed, will be explained below.

(1) As shown in FIG. 13, all memory cell data on an appropriate word line for programming are fetched in the latch circuit (not shown in the figure) following the paths marked with an arrow via the switch circuit (switching transistor to the right) formed in the well 5-1.

The FIG. 13 shows the case that the memory cell bits of the wells 1-1 and 1-2 are "1" and "0" each, and "0" and "1" respectively.

Figure 14:
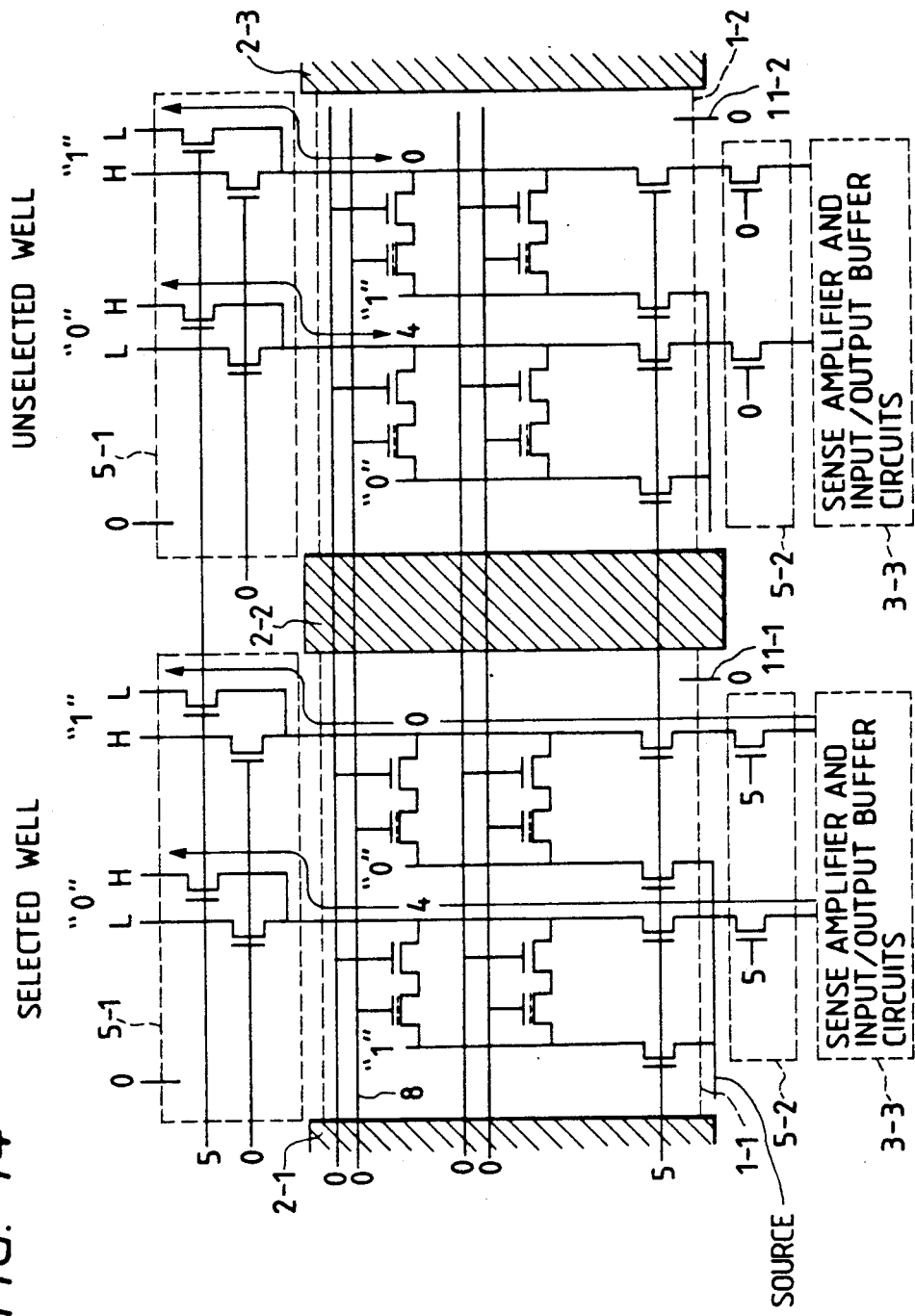

(2) As shown in FIG. 14, new input data are fetched into the data latch circuit from outside depending on an requesting address according to the path marked with an arrow. At this time, input data is entered from the I/0 circuit on the well 3-3 via the switch circuit called "Y gate" on the well 5-2. FIG. 14 shows the case that the Y gate corresponding to the well 1-1 becomes conductive, the input data "0" and "1" are entered into the data latch circuit, then the Y gate corresponding to the well 1-2 become non-conductive and the data of the data latch circuit are still "0" and "1" like FIG. 1.

Figure 15:
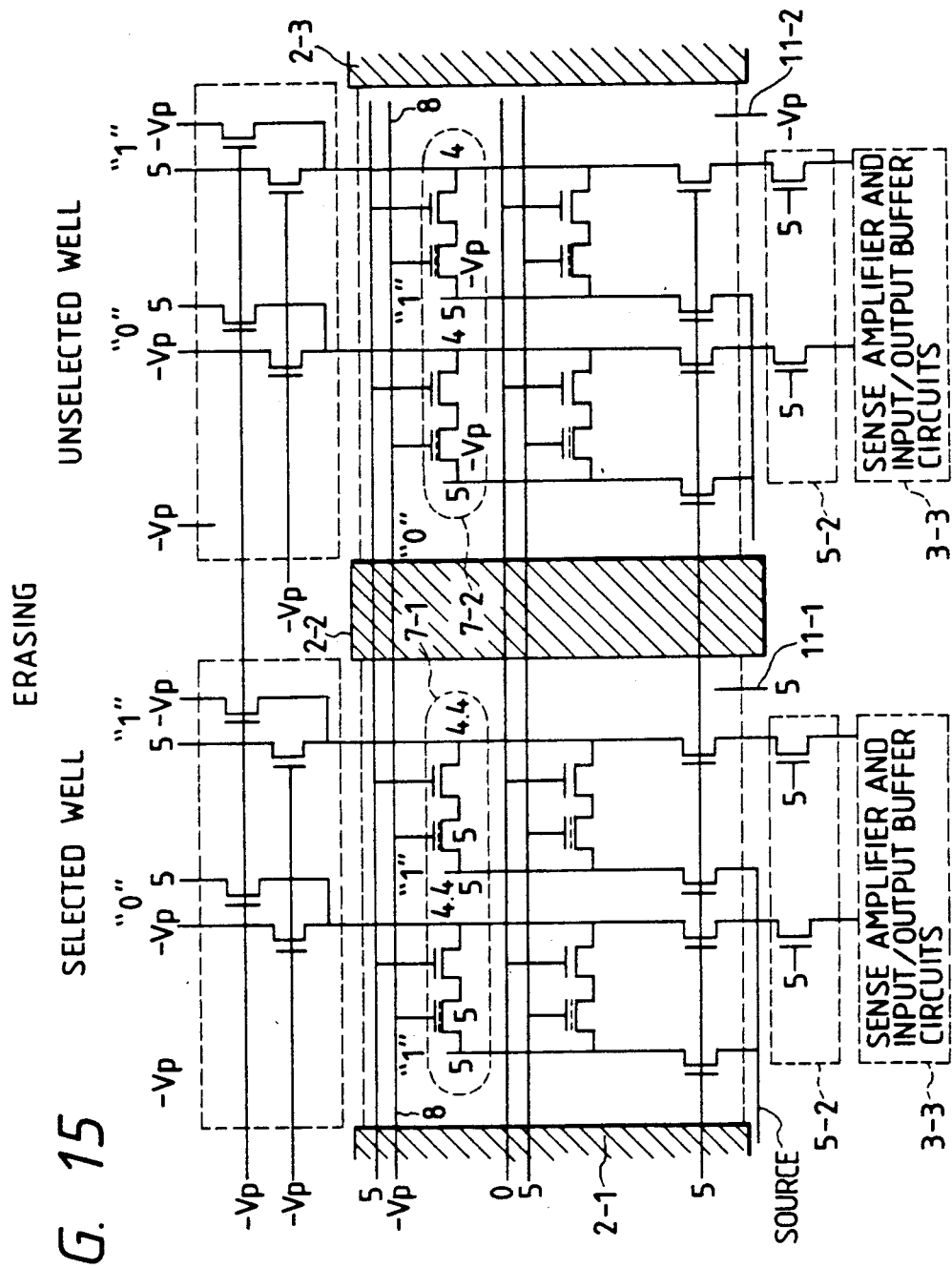

(3) As shown in FIG. 15, the old data in the memory cell at the address 7-1 of a selected well 1-1 for writing new data is erased. This is performed by changing the voltage to be applied on the bias electrode 11-1 set to the well 1-1 to 5 V and applying negative high voltage −Vp on the word line 8 . At this time, because it is necessary to prevent the old data of the memory array (address 7-2) of an unselected well 1-2 from being erased, the voltage applied to the bias electrode 11-2 of the unselected well 1−2 is changed to the same negative high voltage -Vp as the voltage of the word line.

Figure 16:
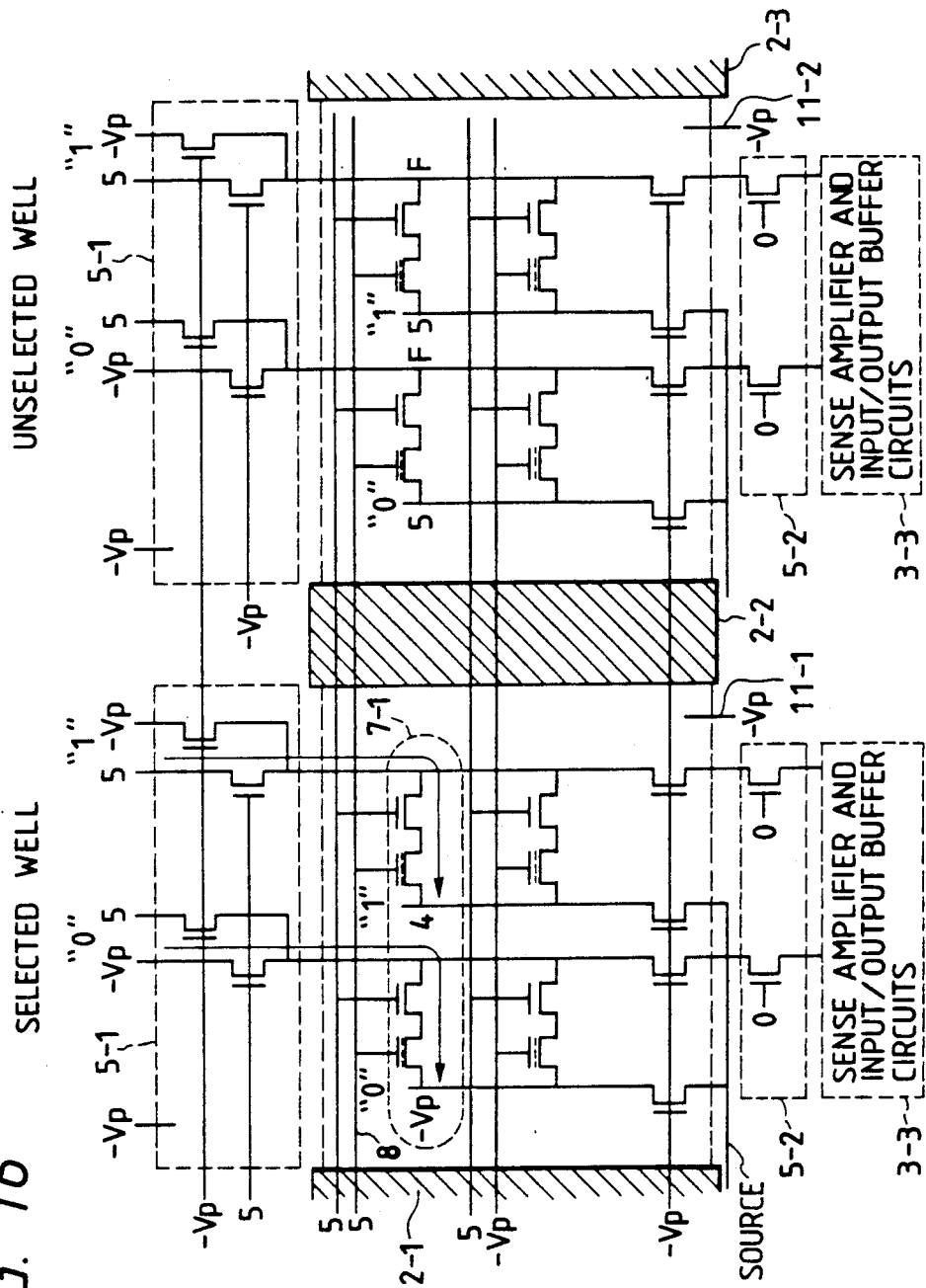

(4) As shown in FIG. 16, to write the data "0" and "1" of the data latch circuit into the cleared memory cell (address 7-1), the voltage indicated is applied to the switch circuit 5-1 installed between the data latch circuit and memory cell. Namely, a specified gate voltage is applied to make the write switch (transistor right) of the switch circuit 5-1 corresponding to the selected well conductive. Consequently, electrons move in the direction indicated by the arrow and the data "0" and "1" of the data latch circuit are written into the memory cell (address 7-1) of the selected well.

Figure 18:
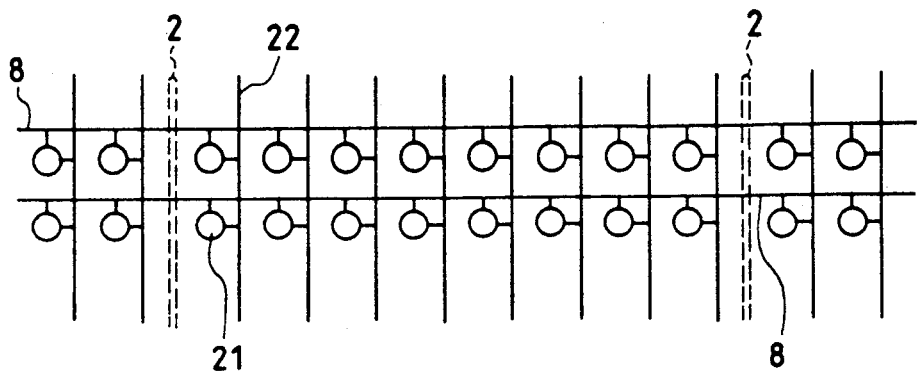
FIG. 18 is the schematic diagram showing the positional relationship of the memory cells and isolation trenches.
Figure 19:
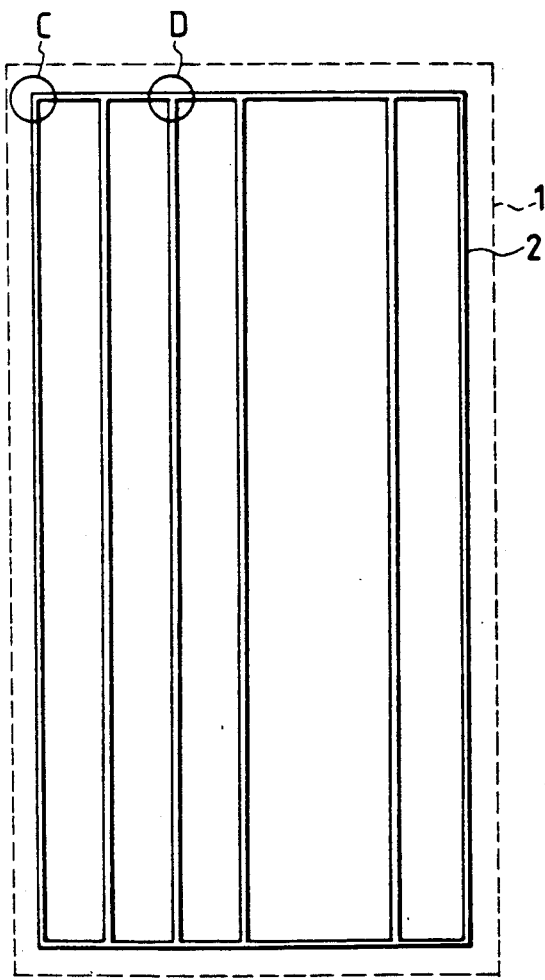
FIG. 19 is the plan view showing the shape and the arrangement of the isolation trenches in the semiconductor integrated circuit device of the conventional technology.
Figure 20:
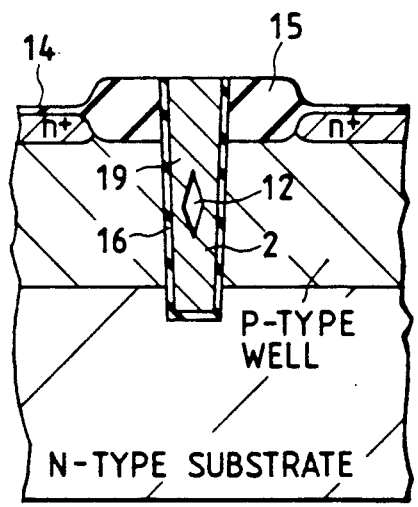
FIG. 20 is the sectional view showing the isolation trench in the semiconductor integrated circuit device of the conventional technology.

(5) As shown in FIG. 17, readout is executed in the unit for byte programming. This is selected by the switch circuits 5-1 and 5-2 called "Y gate". Although, for convenience, FIGS. 13 through 17 show the case that the number of the memory cells connected to the word line 8 in the isolated well is 2 bits, actually the number of memory cells divided by the well on a word line 8 is 1 byte as the minimum unit or 8 bits, as shown in FIG. 18. Alternatively, it is possible to multiply 8 bits with the n square of 2 (n = 1, 2, 3, ---), like 16 bits, 32 bits, 64 bits ---. In addition, it is permitted to add an error correcting parity bit to the integer multiply of a byte. In this case, 4-bit is added as parity in the case of 8 bits. In the cases of 16 bits, 32 bits, and 64 bits, 5-bit, 6-bit and 7-bit are added respectively. If the way to add a parity bit for correcting these errors is applied, the bit number in a well when the well is isolated are 12 bits, 21 bits, 38 bits and 71 bits each. In FIG. 18, the numerals 2, 8, 21 and 22 indicate the isolation trench, word line, memory cell and bit line.

In the semiconductor integrated circuit device or the semiconductor memory device of the present embodiment, the characteristic defect ratio due to junction leak is 1% and the reliability defect ratio due to temperature cycle test is about 0.1%. On the other hand, in the case of the semiconductor memory device based on the conventional technology, described in Japanese Patent Laid-Open 61-281546, the characteristic defect ratio due to junction leak is 10% and the reliability defect ratio due to temperature cycle test is about 1%. As evident from this fact, in the semiconductor integrated circuit device of the present invention, the characteristic defect ratio and reliability defect ratio have been reduced considerably as compared with the product based on the conventional technology.

Although the embodiment mentioned above concerns the semiconductor memory device, the present invention is not confined to the memory device. In the case of the memory device, negative high voltage −Vp, applied in the above embodiment, is very effective for MNOS transistor memory. However, it is evident that this can be used for other memory devices.

In each drawing mentioned above, the identical reference numerals and symbols indicate substantially the same object.

According to the present invention, because each of the isolation trenches isolating the wells is formed in a substantially straight-lined state, a cavity therein or concentrated stress seldom occurs or develops. Therefore, it is possible to solve the problems otherwise resulting because of unstable characteristics and reliability problems such as a junction leak and mechanical destruction, present in conventional schemes. This can realize the stable isolation of a well and raise productivity, and provides an effective means for realizing a highly functional semiconductor integrated circuit device with high economic efficiency, in particular, the non-volatile memory (EEPROM) electrically programmable whose individual wells need to be supplied with different voltages.

What is claimed is:

1. A semiconductor integrated circuit device comprising a plurality of second well regions of the same conductivity type formed by dividing a first well region provided in a semiconductor substrate by a plurality of isolation trenches extending orthogonally inwardly from the surface of said first well region toward said substrate and being extended lengthwise in a direction parallel to the surface of said substrate without having a part at which at least two of said plurality of isolation trenches intersect, while both ends of each of said plurality of isolation trenches, of the corresponding lengths thereof, extend beyond the corresponding end sides of said first well region to which said plurality of isolation trenches belong.

2. A semiconductor integrated circuit device according to claim 1, wherein each of said plurality of isolation trenches is extended deeper into the substrate than said first well region.

3. A semiconductor integrated circuit device according to claim 1, wherein each of said plurality of isolation trenches is linear as seen in a plan view of said semiconductor substrate.

4. A semiconductor integrated circuit device according to claim 1, wherein each of said plurality of isolation trenches is filled with polycrystalline silicon and/or insulator.

5. A semiconductor integrated circuit device according to claim 4, wherein a side wall of each of said plurality of isolation trenches is inclined, with respect to the substrate front face, at an angle to or less than 85 degrees.

6. A semiconductor integrated circuit device comprising a plurality of second well regions of the same conductivity type formed by dividing a first well region provided in a semiconductor substrate by a plurality of isolation trenches extending orthogonally inwardly from the surface of said first well region while said plurality of isolation trenches extend substantially parallel to each other, inn a direction parallel with the surface of said first well region, within said semiconductor substrate and whereby the ends of the lengths of each of said plurality of isolation trenches extend beyond the corresponding end sides of said first well region.

7. A semiconductor integrated circuit device according to claim 1, wherein at least a memory cell capable of electrically erasing written information is formed at least in part of said second well regions.

8. A semiconductor integrated circuit device according to claim 7, wherein a peripheral circuit driving said memory cell is formed on another second well region neighboring said second well region on which said memory cell is formed.

9. A semiconductor integrated circuit device according to claim 7, wherein the number of said at least a memory cell formed in one of said second well regions is set to coincide with an integer multiple of the number of bits corresponding to a unit of readout/write.

10. A semiconductor memory device comprising a memory cell group formed in a well region of a semiconductor substrate and comprising a peripheral circuit on another well region for erasing, group, wherein region obtained by isolating a first well region, having a specified width and length as seen from a plan view of the semiconductor substrate and a specified depth as seen from a cross-sectional view of the semiconductor substrate, by a plurality of linear isolation trenches and each of said linear isolation trenches is longer than the specified width of said first well region and deeper into the substrate than is the specified depth of said first well region.

11. A semiconductor memory device according to claim 10, wherein said peripheral circuit is formed in a well region which has a different conductivity type from said second well region and which is formed near an end of each of said isolation trenches.

12. A semiconductor memory device according to claim 10, wherein the number of memory cells connected to one word line among said memory group on said second well region is set to coincide with a bit number inn the unit of readout/write.

13. A semiconductor integrated circuit device according to claim 1, wherein said semiconductor integrated circuit device is an EEPROM.

14. A semiconductor integrated circuit device according to claim 13, wherein the memory cell of said EEPROM is an MNOS memory cell.

15. A semiconductor integrated circuit device according to claim 14, wherein said MNOS memory cell is a two transistor type cell.

16. A semiconductor integrated circuit device according to claim 6, wherein said semiconductor integrated circuit device is ann EEPROM.

17. A semiconductor integrated circuit device according to claim 16, wherein the memory cell of said EEPROM is an MNOS memory cell.

18. A semiconductor integrated circuit device according to claim 17, wherein said MNOS memory cell is a two transistor type cell.

19. A semiconductor memory device according to claim 10, wherein said semiconductor memory device is an EEPROM.

20. A semiconductor memory device according to claim 19, wherein the memory cell of said EEPROM is an MNOS memory cell.

21. A semiconductor memory device according to claim 20, wherein said MNOS memory cell is a two transistor type cell.

* * * * *

UNITED STATES PATENT AND TRADEMARK OFFICE
CERTIFICATE OF CORRECTION

PATENT NO. :     5,038,193

DATED      :     August 6, 1991

INVENTOR(S) :    Y. KAMIGAKI et al.

It is certified that error appears in the above-identified patent and that said Letters Patent is hereby corrected as shown below:

On title page, item [73], should read as followed:

-- Hitachi, Ltd.; Hitachi VLSI Engineering Corporation --

Signed and Sealed this

Twenty-fourth Day of August, 1993

Attest:

BRUCE LEHMAN

*Attesting Officer*     *Commissioner of Patents and Trademarks*